(12) United States Patent
Hoover et al.

(10) Patent No.: US 7,339,791 B2
(45) Date of Patent: Mar. 4, 2008

(54) CVD DIAMOND ENHANCED MICROPROCESSOR COOLING SYSTEM

(75) Inventors: David S. Hoover, New Tripoli, PA (US); Ronald R. Petkie, Macungie, PA (US)

(73) Assignee: Morgan Advanced Ceramics, Inc., Hayward, CA (US)

( * ) Notice: Subject to any disclaimer, the term of this patent is extended or adjusted under 35 U.S.C. 154(b) by 0 days.

(21) Appl. No.: 10/466,377

(22) PCT Filed: Jan. 18, 2002

(86) PCT No.: PCT/US02/01436

§ 371 (c)(1),
(2), (4) Date: Jan. 13, 2004

(87) PCT Pub. No.: WO02/058143

PCT Pub. Date: Jul. 25, 2002

(65) Prior Publication Data

US 2004/0105237 A1 Jun. 3, 2004

Related U.S. Application Data

(60) Provisional application No. 60/263,576, filed on Jan. 22, 2001.

(51) Int. Cl.
*H05K 7/20* (2006.01)

(52) U.S. Cl. .................. 361/711; 361/760; 361/741; 174/259; 174/261

(58) Field of Classification Search ............ 361/711, 361/760, 720, 736, 740, 683–688, 702–704, 361/367, 370, 752, 797, 800, 730, 741; 428/408; 257/E23.111; 174/259, 261, 117 A See application file for complete search history.

(56) References Cited

U.S. PATENT DOCUMENTS

| 3,243,498 A | 3/1966 | Allen et al. |
| 3,351,543 A | 11/1967 | Vanderslice |
| 3,356,473 A | 12/1967 | Hull et al. |
| 3,816,194 A | 6/1974 | Kroger et al. |

(Continued)

FOREIGN PATENT DOCUMENTS

| EP | 0 284 150 A1 | 9/1988 |
| JP | 51-94771 A | 8/1976 |
| JP | 0 140 600 A2 | 5/1985 |
| JP | 61-144036 | 7/1986 |
| JP | 62-24647 | 2/1987 |
| JP | 62-224048 | 10/1987 |
| JP | 2-226749 | 9/1990 |
| WO | WO 80/01222 | 6/1980 |
| WO | WO 01/31082 A1 | 5/2001 |
| WO | WO 01/92185 | 12/2001 |
| WO | WO 02/058143 A2 | 7/2002 |
| WO | WO 03/027043 | 4/2003 |

OTHER PUBLICATIONS

Hoover,, et al., "Diamond Thin Film: Applications in Electronics Packaging," *Slid State Technology*, pp. 89-91 (Feb. 1991).

(Continued)

*Primary Examiner*—Tuan T. Dinh
*Assistant Examiner*—Hung S Bui
(74) *Attorney, Agent, or Firm*—Dean W. Russell; Kristin M. Crall; Kilpatrick Stockton LLP

(57) ABSTRACT

Cooling systems for microprocessors are addressed. Some systems may include a chemical vapor deposited (CVD) diamond heatspreader mounted to a base of a heat sink and to a microprocessor chip, while others may include a copper insert mounted within a depression of a heat sink, with the CVD diamond heatspreader mounted within an indent of the insert.

19 Claims, 9 Drawing Sheets

U.S. PATENT DOCUMENTS

| | | | |
|---|---|---|---|
| 4,117,968 A | 10/1978 | Naidich et al. | |
| 4,342,632 A | 8/1982 | Heim et al. | |
| 4,425,195 A | 1/1984 | Papanicolaou | |
| 4,738,689 A | 4/1988 | Gigl et al. | |
| 4,776,862 A | 10/1988 | Wiand | |
| 4,899,922 A | 2/1990 | Slutz et al. | |
| 4,931,363 A | 6/1990 | Slutz et al. | |
| 5,008,737 A * | 4/1991 | Burnham et al. | 257/712 |
| 5,024,680 A | 6/1991 | Chen et al. | |
| 5,186,973 A | 2/1993 | Garg et al. | |
| 5,224,969 A | 7/1993 | Chen et al. | |
| 5,234,153 A | 8/1993 | Bacon et al. | |
| 5,239,746 A | 8/1993 | Goldman | |
| 5,250,086 A | 10/1993 | McEachron et al. | |
| 5,299,214 A | 3/1994 | Nakamura et al. | |
| 5,324,987 A | 6/1994 | Iacovangelo et al. | |
| 5,328,715 A | 7/1994 | Iacovangelo et al. | |
| 5,348,108 A | 9/1994 | Scott et al. | |
| 5,371,407 A | 12/1994 | Goldman | |
| 5,382,758 A | 1/1995 | Iacovangelo et al. | |
| 5,455,457 A * | 10/1995 | Kurokawa | 257/712 |
| 5,457,342 A * | 10/1995 | Herbst, II | 257/712 |
| 5,495,126 A | 2/1996 | Iguchi et al. | |
| 5,500,248 A | 3/1996 | Iacovangelo et al. | |
| 5,529,805 A | 6/1996 | Iacovangelo et al. | |
| 5,567,985 A | 10/1996 | Iacovangelo et al. | |
| 5,619,399 A | 4/1997 | Mok | |
| 5,626,909 A | 5/1997 | Iacovangelo | |
| 5,696,665 A | 12/1997 | Nagy | |
| 5,734,554 A * | 3/1998 | Mitty et al. | 361/697 |
| 5,767,578 A | 6/1998 | Chang et al. | |
| RE35,845 E | 7/1998 | Butera | |
| 5,786,633 A | 7/1998 | Wolfgang et al. | |
| 5,787,971 A * | 8/1998 | Dodson | 165/121 |
| 5,804,321 A | 9/1998 | Thorpe et al. | |
| 5,849,413 A | 12/1998 | Zhu et al. | |
| 5,853,888 A * | 12/1998 | Dutta et al. | 428/408 |
| 5,858,537 A * | 1/1999 | Brown et al. | 428/408 |
| 5,874,175 A | 2/1999 | Li | |
| 5,940,269 A | 8/1999 | Ko et al. | |
| 6,019,165 A | 2/2000 | Batchelder | |
| 6,021,844 A | 2/2000 | Batchelder | |
| 6,068,070 A | 5/2000 | Scott | |
| 6,114,761 A * | 9/2000 | Mertol et al. | 257/722 |
| 6,181,556 B1 * | 1/2001 | Allman | 361/690 |
| 6,531,226 B1 | 3/2003 | Petkie | |
| 6,914,330 B2 * | 7/2005 | Kneringer et al. | 257/712 |
| 6,919,525 B2 * | 7/2005 | Pinneo | 219/121.38 |
| 2002/0114963 A1 | 8/2002 | Petkie | |
| 2003/0183368 A1 * | 10/2003 | Paradis et al. | 165/80.3 |

OTHER PUBLICATIONS

Dahlgren, et al., "High-Pressure Polycrystalline Diamond as a Cost Effective Heat Spreader," *2000 Inter Society Conference on Thermal Phenomena*, pp. 296-303 (2000).

Database WPI Section Ch, Week 197640, Derwent Publications Ltd., London, GB; AN 1976-74815X XP002178785 & JP 51 094771 A (Nippon Teleg & Tel Corp), Aug. 19, 1976 Abstract.

Petkie, Ronald, "Packaging Aspects of CVD Diamond in High Performance Electronics Requiring Enhanced Thermal Management," *1998 International Symposium on Advanced Packaging Materials*, Mar. 15-18, 1998, pp. 223-228.

Jahangir, et al., "A highly adhesive gold-based metallization system for CVD diamond substrates," *Proceedings of the Sixth International Symposium (Electrochemical Society Proceedings)*, Honolulu, Hawaii, Oct. 17-22, 1999 (Abstract XP-002178784).

* cited by examiner

CVD DIAMOND ENHANCED MICROPROCESSOR COOLING SYSTEM

CROSS-REFERENCE TO RELATED APPLICATION

This application is the U.S. national phase of International Application No. PCT/US02/01436 filed on Jan. 18, 2002, published in English as International Publication No. WO 02/058143 on Jul. 25, 2002, which claims priority to U.S. Provisional Application No. 60/263,576 filed on Jan. 22, 2001, the contents of which are hereby incorporated by reference.

FIELD OF THE INVENTION

The invention is a microprocessor cooling system for mounting to a main processor chip. The cooling system finds use to permit current central processing units (CPU's) to operate more effectively at speeds of up to about one gigahertz or greater.

BACKGROUND OF THE INVENTION

Current methods to increase the performance of desktop computers include using a heat sink assembly that incorporates aluminum as the material of choice. In such an assembly, cooling fans are mounted on aluminum fins on an aluminum thermal conductive base or heat sink base. The aluminum base is mounted directly on the CPU chip. Such assemblies enable CPU's to effectively operate at 800 megahertz (MHz) with a 1.8 voltage core. However, at the same voltage, the CPU overheats and the system fails at 850 MHz and greater.

Batchelder, U.S. Pat. Nos. 6,019,165 and 6,021,844 disclose and claim a heat transfer device for conducting heat from a semi-conductor chip to a heat absorber. The device consists of a thermally conductive rotor, a thermal transfer fluid, e.g., mercury or liquid gallium, and a composite that contains the rotor and the heat transfer fluid. These references teach away from the prior art solution using air as the heat transfer fluid and the combination of a thermally conductive rotor and a passive heat spreader plate of aluminum and even heat spreaders of more costly alternatives including silver and diamond. The conclusion reached by the patentees is that none of these materials are capable of dissipating the heat generated by the microprocessor of the future.

There is a need for a system that increases the performance of CPU's to 1000 MHz or greater.

SUMMARY OF THE INVENTION

The microprocessor cooling system of the present invention overcomes the problems of prior art heat sink assemblies by incorporating a diamond insert within the prior art heat sink base that are mounted directly on the CPU chip. One embodiment of the system comprises a heat sink body including a plurality of cooling fins attached to a heat sink base, at least one cooling fan attached to the cooling fins, a chemical vapor deposited (CVD) diamond having an inner surface mounted to the outer surface of the heat sink base and an outer surface positioned for mounting directly on the CPU chip.

In another embodiment of the system comprises a copper insert having an indent equidistant from each of the ends of the heat sink base and mounted within a depression in the heat sink base and the CVD diamond having an inner surface mounted within the indent and an outer surface positioned for mounting directly onto the CPU chip.

The invention is applicable to:
(1) Conversion kits to enable owners to modify their existing processors.
(2) Original equipment manufacturers (OEM's).
(3) Upgrading by OEM's.

BRIEF DESCRIPTION OF THE DRAWINGS

Further features and advantages will become apparent from the following and more particular description of the preferred embodiment of the invention, as illustrated in the accompanying drawing in which.

DETAILED DESCRIPTION OF THE INVENTION

Figure 1:
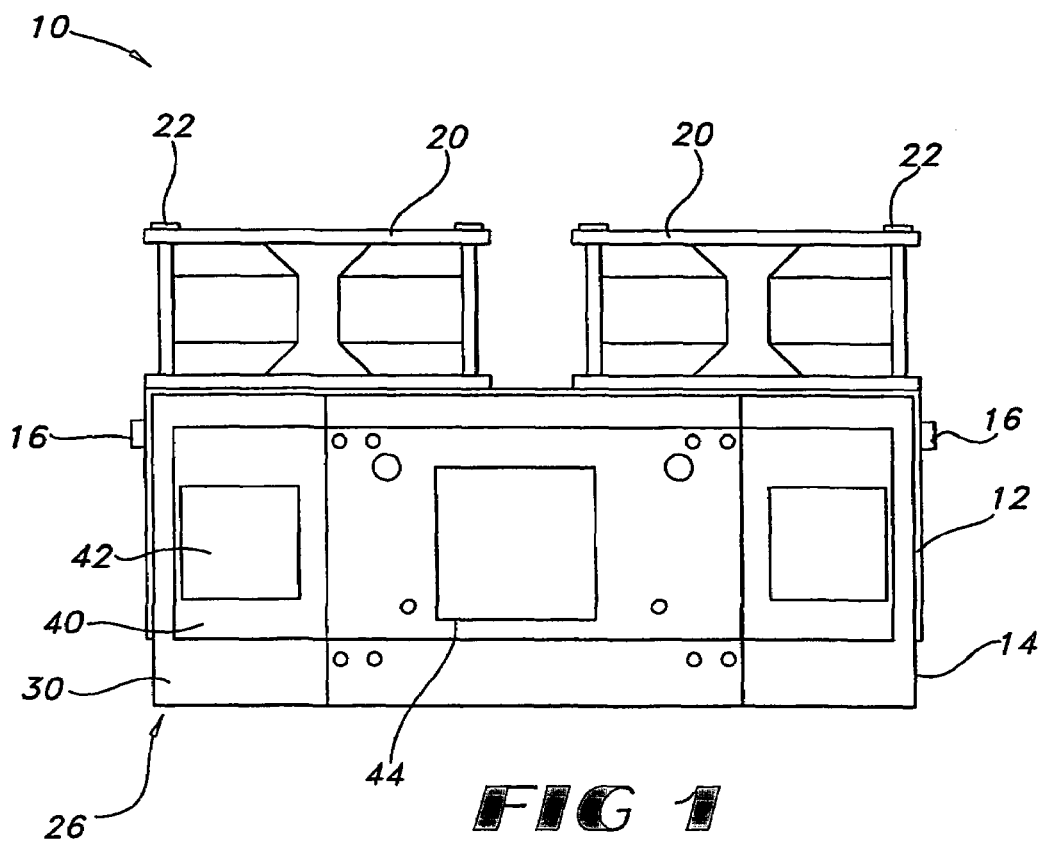
FIG. 1 is a diagrammatic bottom view of the microprocessor cooling system of the present invention.
Figure 2:
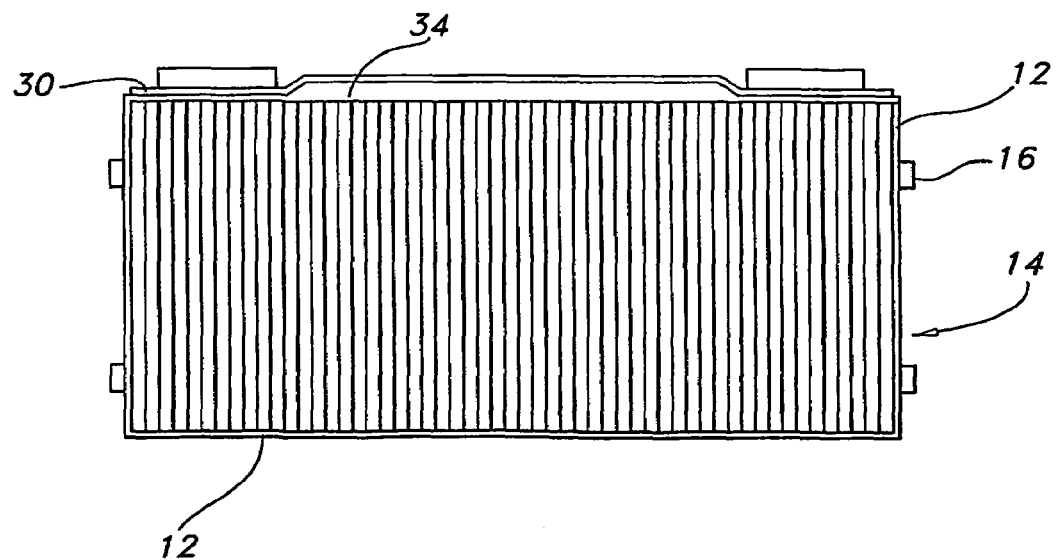
FIG. 2 is a diagrammatic view of one side of the microprocessor cooling system of the present invention.
Figure 3:
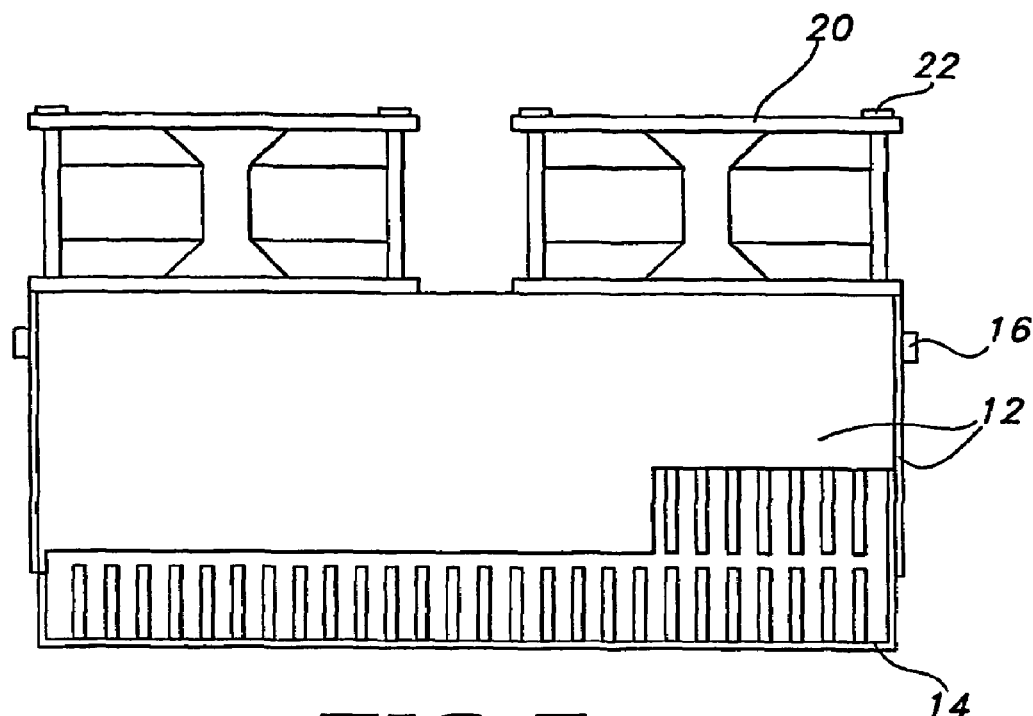
FIG. 3 is a diagrammatic top view of the microprocessor cooling system of the present invention.
Figure 6:
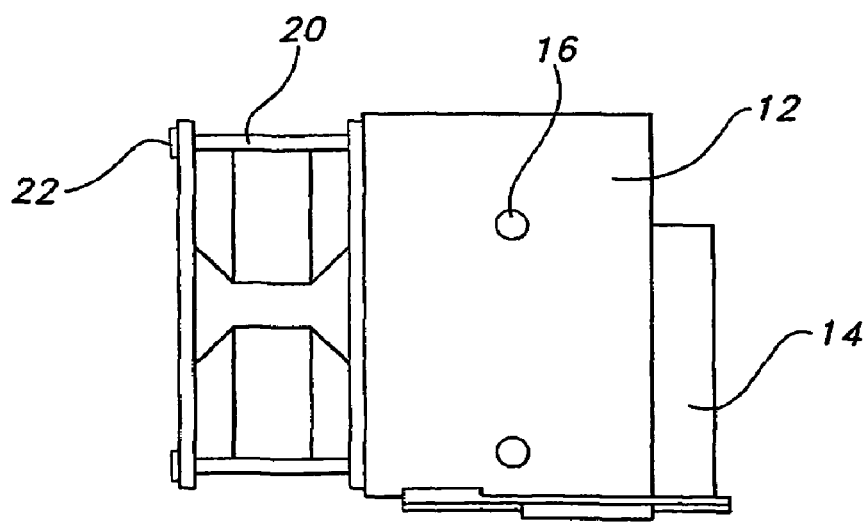
FIG. 6 is a diagrammatic view of the other end of the microprocessor cooling system of the present invention.
Figure 4:
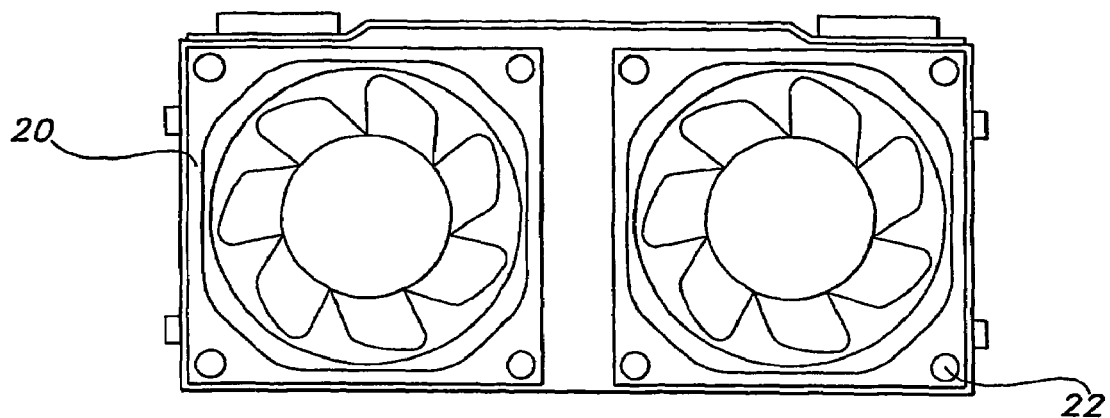
FIG. 4 is a diagrammatic view of the other side of the microprocessor cooling system of the present invention.
Figure 5:
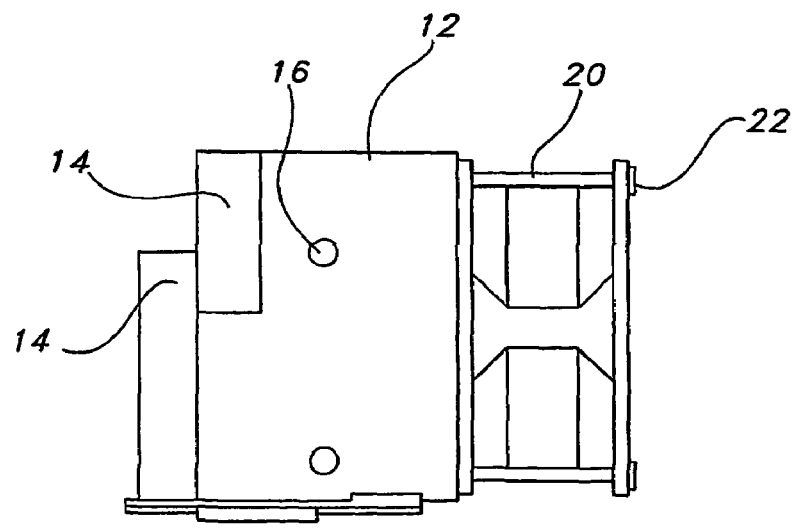
FIG. 5 is a diagrammatic view of one end of the microprocessor cooling system of the present invention.
Figure 7:
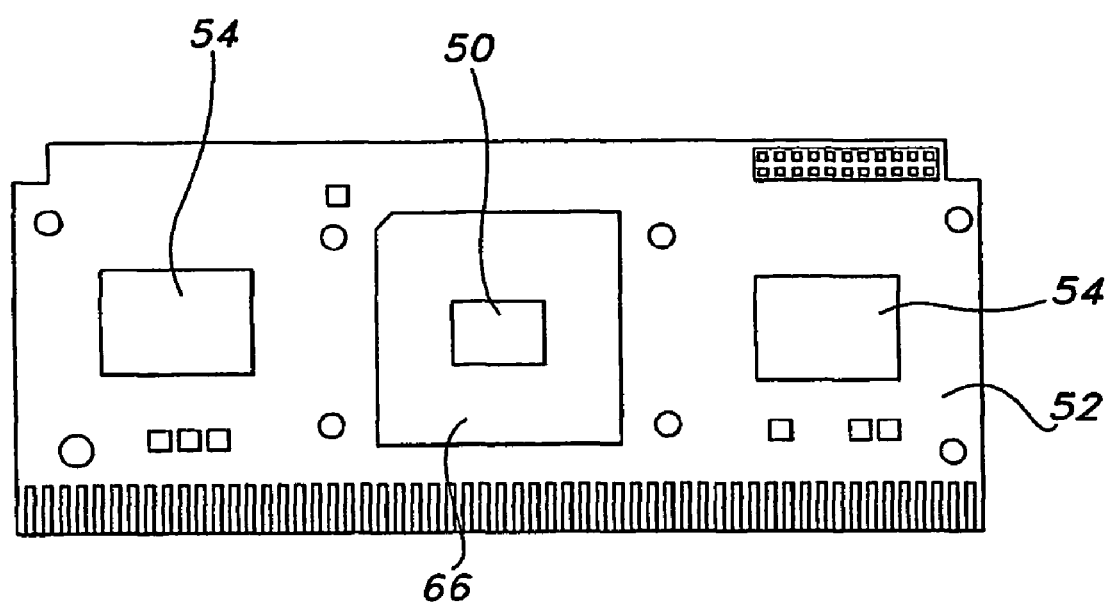
FIG. 7 is a diagrammatic view of the surface side of a microchip on a motherboard of a CPU on which the microprocessor cooling system of the present invention is mounted.

FIGS. 1-6 are illustrative of a typical configuration of the microprocessor of the cooling system 1 of the present invention for mounting on the main processor chip on the CPU motherboard. Cooling system 10 combines chassis 12, cooling fin array 14 attached to the chassis 12 by fasteners 16, fans 20 attached to chassis 12 by fasteners 22, and heat spreader 26. Heat spreader 26 comprises aluminum back plate 30 mounted on base 34 of fin array 14. Copper insert 40 is mounted within aluminum plate 30 as shown in FIG. 1. Two copper spacers 42 are mounted substantially to copper inserts 40 as shown in FIG. 1. Diamond insert 44 is mounted within copper insert 40 and positioned for attachment over the main CPU chip 50 of the motherboard 52 shown in FIG. 7. Similarly, copper inserts 40 are positioned for attachment over cache memory chips 54 as shown in FIG. 7. The surface area of diamond insert 44 is at least twice the surface area of chip 50 that diamond insert 44 is in contact with. Preferably the area ratio of diamond chip 44 to chip 50 is 6:1 to achieve optimum heat spreading capability and still be cost effective. It is critical that the surface of the diamond chip 44 that comes into contact with the surface of chip 50 is smooth and flat to make good contact with chip 50.

Figure 8:
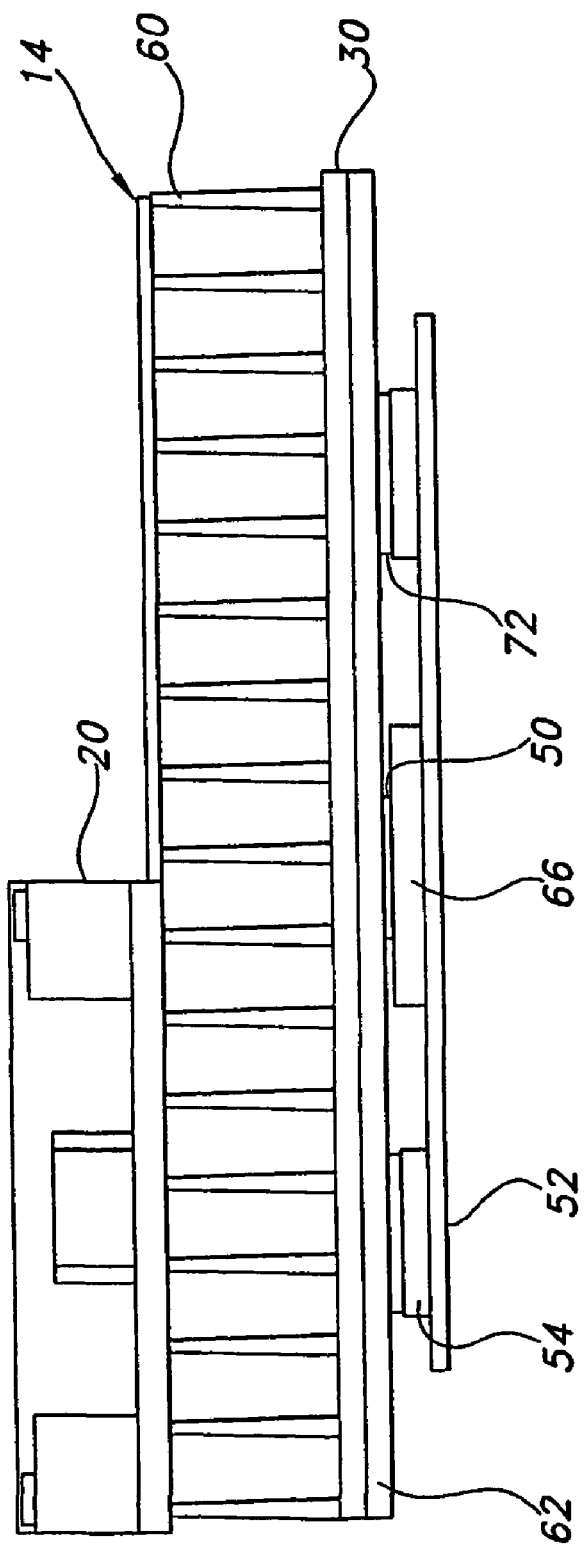
FIG. 8 is a diagrammatic cross-sectional view through a prior art cooling system mounted on the CPU motherboard shown in FIG. 7.

FIG. 8 illustrates the configuration of an Athlon™ Processor cooling system mounted on the main processor chip 50 of the motherboard 52. The cooling system consists of fan 20, fin array 14 and a heat spreader consisting of aluminum back plate 62 mounted to aluminum heatsink base 30. Aluminum back plate 62 is shown mounted on chip 50 attached to motherboard 52 by processor chip carrier 66. Aluminum spacers 72 are mounted on cache memory chips 54.

Figure 9:
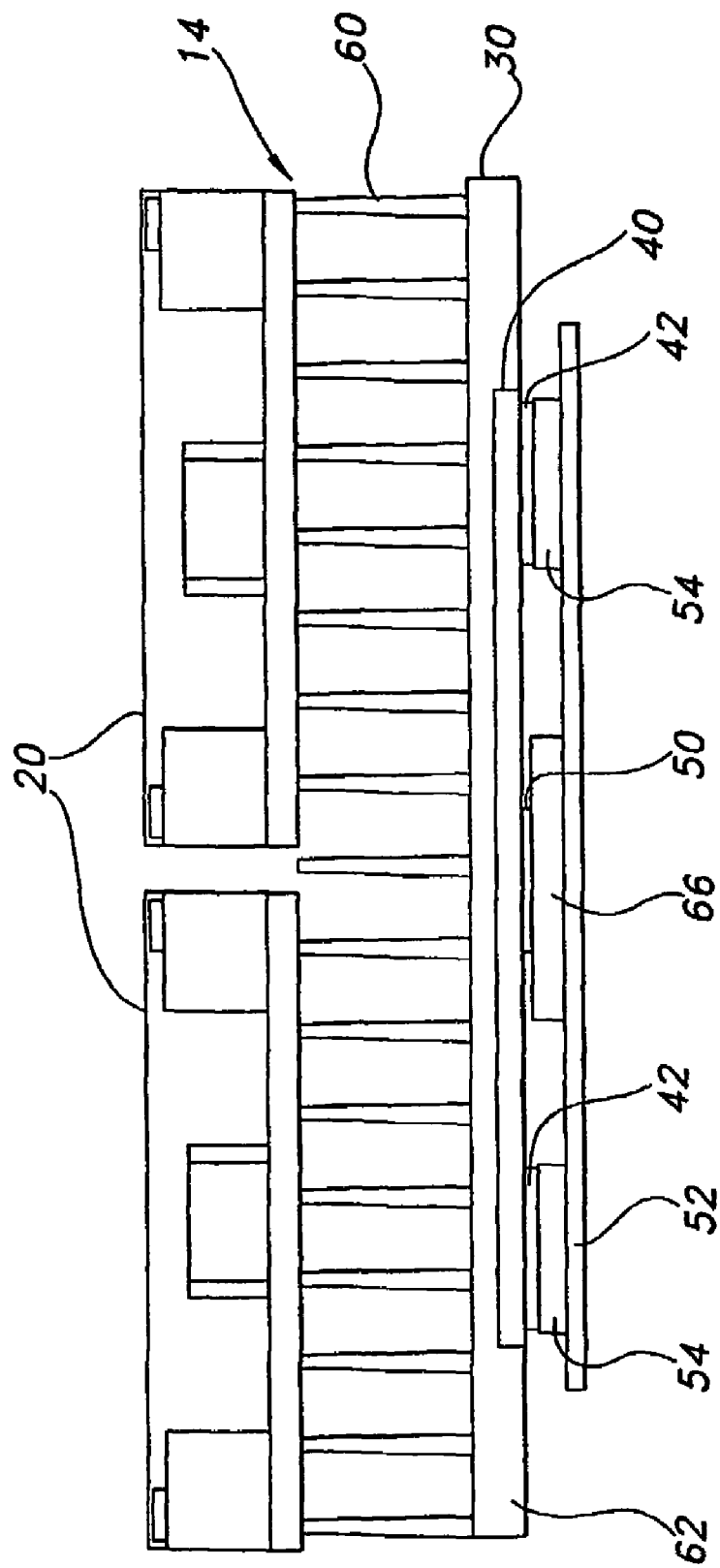
FIG. 9 is a diagrammatic cross-sectional view through another prior art cooling system on the motherboard FIG. 7.

FIG. 9 illustrates the configuration of an alternate embodiment of the Athlon™ Processor cooling system mounted on the main processor chip 50 of the motherboard 52.

In this embodiment, the cooling system consists of fan 20, fin array 14 and a heat spreader consisting of aluminum heatsink base 30 that includes copper insert 40. Copper insert 40 is shown mounted on chip 50 attached to motherboard 52 by processor chip carrier 66. Copper spacers 42 are mounted on cache memory chips 54.

Figure 10:
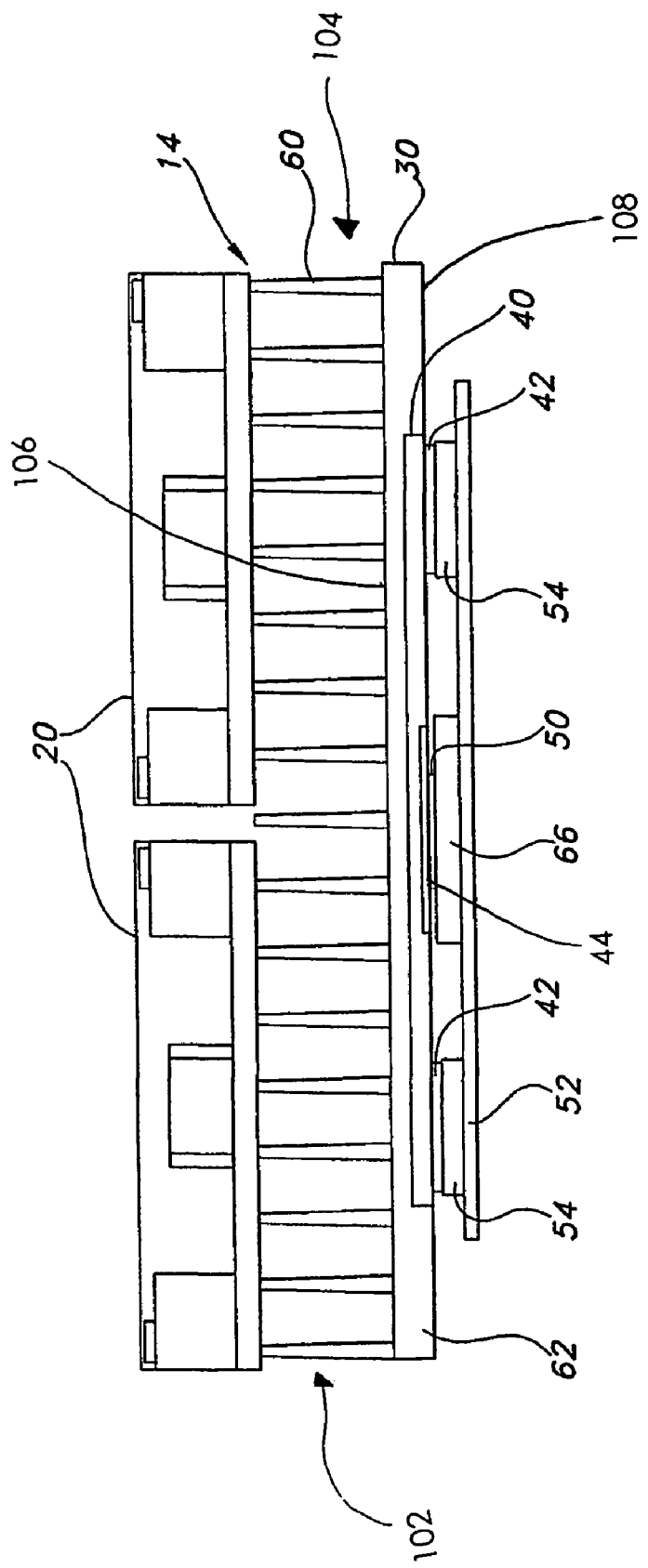
FIG. 10 is a diagrammatic cross-sectional view through the cooling system of one embodiment of the present invention mounted on the CPU motherboard shown in FIG. 7.

FIG. 10 illustrates the configuration of the cooling system of the present invention mounted on the main processor chip 50 of the motherboard 52. In this embodiment, the cooling system consists of fan 20, fin array 14 and a heat spreader consisting of aluminum heat sink base 30 including copper insert 40 and CVD diamond insert 44 within depression in copper insert 40. The heat sink base 30 is shown having two ends 102 and 104, an inner surface 106, and a lower (or outer) surface 108. Diamond insert 44 is shown mounted on chip 50 attached to motherboard 52 by processor chip carrier 66. Copper spacers 42 are mounted on cache memory chips 54.

Figure 11:
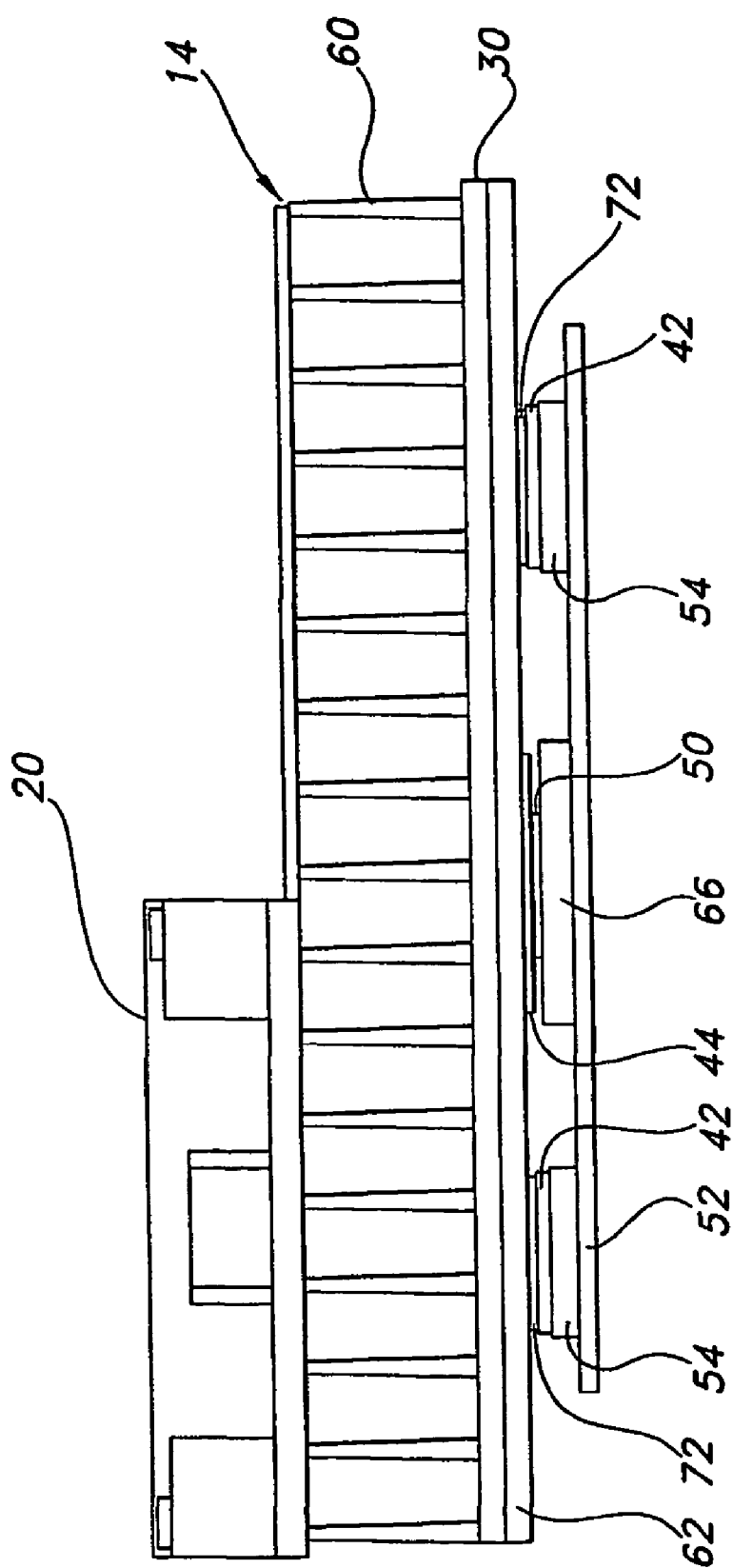
FIG. 11 is a diagrammatic cross-sectional view through the cooling system of another embodiment of the present invention mounted on the CPU motherboard shown in FIG. 7.

FIG. 11 illustrates the configuration of the cooling system of the present invention mounted on the main microprocessor chip 50 of the motherboard 52. In this embodiment, the cooling system consists of fan 20, fin array 14 and a heat spreader consisting of aluminum back plate 62 mounted to aluminum heat sink base 30 and CVD diamond heatspreader 44 mounted to back plate 62. Diamond heatspreader 44 is shown mounted on chip 50 attached to motherboard 52 by processor chip carrier 66 Aluminum spacers 72 are mounted on cache memory chips 54.

A critical feature of the present invention is that diamond heatspreader insert 44 is in intimate contact with both the chip and the heatsink to achieve the optimum results of improving performance, i.e., increased processor speed. This means that at least on the side of the diamond that is in contact with the chip, the diamond material is flat and smooth because the chip is flat and smooth. This may be achieved by optimizing deposition conditions or by post-deposition polishing such as chemical polishing or mechanical polishing. Excellent thermal contact must also be established between the diamond and the heatsink. There are several ways to establish excellent thermal contact between the planar surface of a heatsink and the CVD diamond heatspreader, including chemical or mechanical polishing of the CVD diamond surface, or planarization of the diamond surface with layers of thick film metalization.

EXAMPLES

Commercial 700 Mhz and 800 Mhz Advanced MicroDevices (AMD) Athlon processors configured with the Standard AMD air-cooled heatsink were evaluated for maximum clock speed and thermal performance. The configuration of the standard AMD air-cooled heatsink is illustrated in FIG. 8. The AMD processors were also configured with an improved copper heatsink assembly manufactured by A-Copper, and were evaluated for maximum clock speed and thermal performance. The configuration of the A-Copper heatsink assembly is illustrated in FIG. 9. Finally, each of these heatsink assemblies was modified to incorporate a CVD diamond heatspreader in accordance with one embodiment of the present invention and was evaluated for maximum clock speed and thermal performance. The configuration of the A-Copper heatsink, modified to incorporate a CVD diamond heatspreader is illustrated in FIG. 10. The configuration of the standard AMD air-cooled heatsink, modified to incorporate a CVD diamond heatspreader is illustrated in FIG. 11.

The 700 MHz and 800 Mhz AMD Athlon processors were separately installed in a CPU tower and tested. The thermal performance of each heatsink system was measured using two thermocouples. The microprocessor case temperature was measured by a first thermocouple placed in direct contact with the case of the processor. The heatsink temperature was measured by a second thermocouple that was installed in the metal heatsink approximately halfway between the microprocessor chip and the cache chip. The case temperature was measured with the microprocessor running only the Microsoft Windows® operating system, and the steady-state "Case Idle" temperature was recorded. Thereafter, a load was applied to the microprocessor by running Winbench test software program, a standard chip protocol program designed to place maximum work on the processor microchip, and the steady-state "Case Loaded" temperature was recorded. With Winbench running, steady-state temperature of the heatsink, i.e. "HS Loaded" was also recorded. The test data are summarized in Examples 1-3 and Tables 1-3.

Example 1

The 700 Mhz AMD Athlon processor was tested in the configurations illustrated in FIGS. 8, 9 and 10. The processor frequency and core voltage were adjusted from 700 Mhz and 1.6 volts core to 880 Mhz and 1.8 volts core, which resulted in an increase in processor power dissipation from 34 Watts (the published value) to 62 Watts. The test results are summarized in Table 1.

It was found that the maximum operating condition of the standard AMD air-cooled heatsink (FIG. 8) was 800 MHz and 1.7 volts core with a maximum power dissipation of 48 Watts, resulting in a Case Loaded temperature of 54.2° C. At 850 Mhz and 1.8 volts core, the chip overheated and the system failed. With the A-Copper heatsink (FIG. 9), at 850 Mhz and 1.8 volts core, with a power dissipation of 57 Watt, the Case Loaded temperature reached 56° C., and the system operated but was unstable, indicating a marginal performance improvement.

Two configurations of the cooling system of the present invention shown in FIG. 10 were fabricated as follows. Devices shown in FIG. 8 were modified by cutting a notch about 1 inch×1 inch in copper insert 40, applying a coating of zinc oxide thermal paste on the surface of the notch and placing diamond heatspreader plate 44 in the notch.

Two diamond heatspreaders (each is shown in FIG. 10) were evaluated. In both cases, sheets of polycrystalline CVD diamond, were grown by the method of hot filament chemical vapor deposition (HFCVD) and using an HFCVD reactor of the type described and claimed in Garg, et al., U.S. Pat. No. 5,186,973, issued Feb. 16, 1993. Diamond Heatsink System 1 utilized a 1 inch×1 inch×750 microns thick, unpolished as grown piece of CVD diamond. The as-grown diamond had a rough side, exhibiting diamond crystal facets, and a smooth side, which replicated the smooth surface of a silicon substrate upon which the diamond was grown. Zinc oxide thermal grease was applied to both sides of the diamond piece to improve contact to the copper and the chip. The rough side of the diamond was placed against the copper. The smooth side of the diamond was placed against the processor chip.

Diamond Heatsink System 2 utilized a 0.9 inch×0.9 inch×670 microns thick, chemically polished piece of CVD diamond. The diamond piece was polished to an average surface roughness of 0.03 micron on one side and 0.1 micron on the other side. After polishing, the diamond was cleaned in a mixture of hydrofluoric acid and nitric acid to remove contaminants and heated treated in air at 500° C. for one hour to remove organic residue and graphitic carbon from the diamond surface. Zinc oxide thermal grease was applied to both sides piece to improve contact to the copper and the chip. The 0.1 micron rough side of the diamond was placed against the copper. The smoother side of the diamond, having a roughness of 0.03 micron, was placed against the processor chip.

With Diamond Heatsink System 1, the processor was successfully operated at 880 Mhz and 1.8 volts core, with a power dissipation of 62 Watts. The system operation was stable, and the Case Loaded temperature reached only 49.6° C. Based on this excellent result, it was anticipated that the system with Diamond Heatsink System 1 would operate at 920 Mhz and 1.8 Volts core, but the cache memory failed because the cache was not compatible with 920 Mhz operation.

With Diamond Heatsink System 2, the thermal improvement was even better. The processor was successfully operated at 880 Mhz and 1.8 volts core, with a power dissipation of 62 Watts. The system operation was stable, and the Case Loaded temperature reached only 41.1° C., a significant improvement over Diamond Heatsink System 1. Higher frequencies and power dissipations could not be tested because the cache memory was not compatible with 920 Mhz operation.

This result shows the importance of obtaining good thermal contact i.e. minimizing the thermal resistance between the diamond and metal heatsink, and between the diamond and the chip. Best results are achieved when the surface of the diamond heatspreader is flat and smooth, to obtain the best thermal contact with the chip.

Example 2

The 700 Mhz AMD Athlon processor was tested in the cooling system configuration of the present invention illustrated in FIG. 11 and compared to the configuration of FIG. 8. The processor frequency and core voltage were adjusted from 700 Mhz and 1.6 volts core to 850 Mhz and 1.8 volts core, which resulted in an increase in processor power dissipation from 34 Watts to 57 Watts. The test results are summarized in Table 2.

It was found that the maximum operating condition of the standard AMD air-cooled heatsink (shown in FIG. 8) was 800 MHz and 1.7 volts core with a maximum power dissipation of 48 Watts, resulting in a Case Loaded temperature of 54.2° C. At 850 Mhz and 1.8 volts core, the Case Idle temperature was very high at 57.2° C., and during the Case Loaded test, the chip overheated and the system failed.

Diamond Heatsink System 3 utilized a 0.9 inch×0.9 inch×670 microns thick, polished piece of CVD diamond, that was polished to an average surface roughness of 0.03 micron on one side and 0.1 micron on the other side, similar to that used in Diamond Heatsink System 2. Zinc oxide thermal grease was applied to both sides of the diamond piece to improve contact to the aluminum and the chip. The 0.1 micron rough side of the diamond was placed against the aluminum. The smoother side of the diamond, having a roughness of 0.03 micron, was placed against the processor chip surface.

With Diamond Heatsink System 3, the processor was successfully operated at 850 Mhz and 1.8 volts core, with a power dissipation of 57 Watts. The system operation was stable. The Case Idle temperature reached only 38.1° C. and the Case Loaded temperature reached only 41.1° C., a large improvement over the standard AMD air-cooled heatsink, and essentially equivalent to the performance of Diamond Heatsink System 2.

Example 3

The 800 Mhz AMD Athlon processor was tested in the cooling system configuration of the present invention illustrated in FIG. 11 with the same Diamond Heatsink System 3 that was used in Example 2. The test results are summarized in Table 3.

With Diamond Heatsink System 3, the processor was successfully operated at 1000 Mhz and 1.9 volts core, with a power dissipation of 97 Watts. The system operation was stable at this frequency and power. The cache was turned off because this high speed was reaching the upper operating limit of the cache.

These Examples showed that compared to prior art microprocessor cooling systems, the diamond enhanced microprocessor cooling systems of the present invention have vastly improved performance. The standard AMD air-cooled heatsink is able to dissipate a maximum of 48 Watts of processor power, the A Copper air-cooled heatsink is able to dissipate 57 Watts of processor power, and the diamond-enhanced cooling system of the present invention is able to dissipate at least 97 Watts of processor power.

Figure 12:
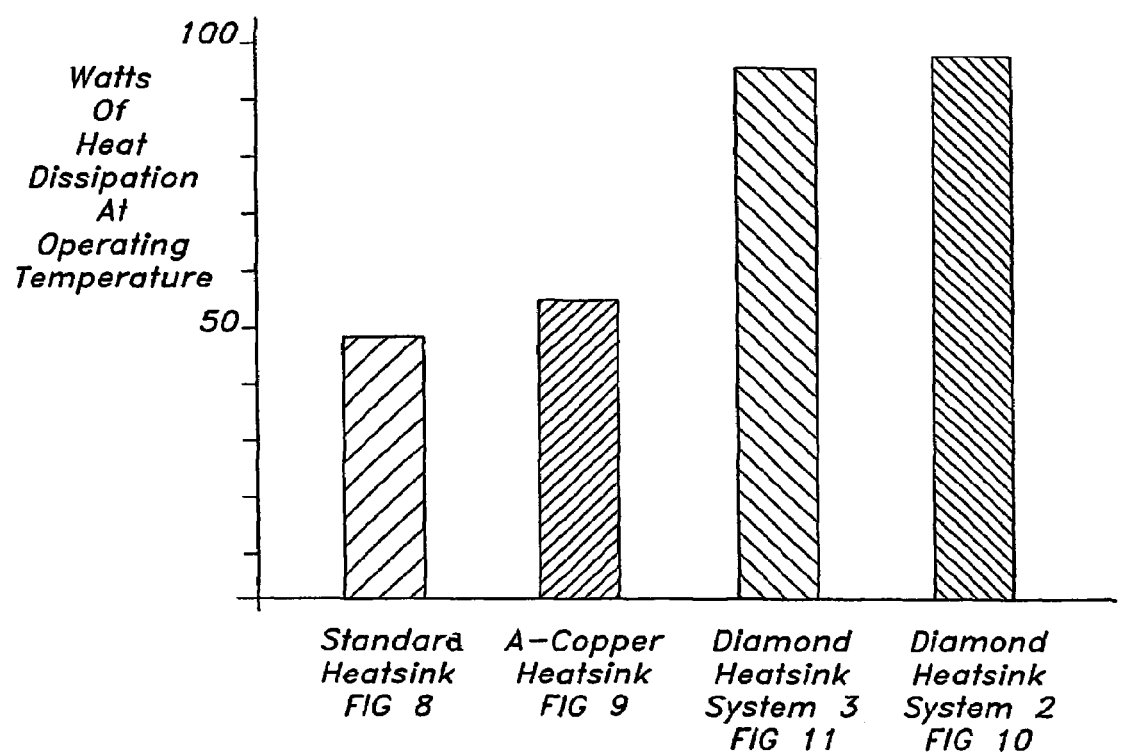
FIG. 12 is a chart illustrating the performance of the cooling systems of the prior art compared with those of the present invention.

FIG. 12 graphically illustrates this improvement in performance of the cooling systems of the present invention compared with those of the prior art.

There are at least two key advantages of the diamond-enhanced cooling system of the present invention over prior art systems. (1) The present invention allows for significant overclocking of commercially available microprocessors to improve computer system performance. (2) The present invention allows for a substantial reduction in processor temperature, which greatly improves processor reliability and lifetime.

TABLE 1

Thermal Test Results using AMD Athlon 700 MHz Processor with Heatsink Systems of Example 1.

| Microprocess or Operating Conditions: Frequency, Core Voltage, Power Dissipated | Measurement Condition | Standard AMD Air-Cooled Heatsink, (See Note 1) Temperatures (° C.) and Comments | A-Copper Heatsink, (See Note 2) Temperatures (° C.) and Comments | Diamond Heatsink System 1, (See Note 3) Temperatures (° C.) and Comments | Diamond Heatsink System 2, (See Note 3) Temperatures (° C.) and Comments |
|---|---|---|---|---|---|
| 700 Mhz, 1.6 Volts Core, 34 Watts | Case Idle | 46.8 | 41.2 | — | 31.7 |
| | Case Loaded | 48.5 | 44.0 | — | 34.1 |
| | HS Loaded | n/a | 37.9 | — | 27.3 |
| | | Ran Well | Ran Well | — | Ran Well |
| 800 Mhz, 1.7 Volts Core, 48 Watts | Case Idle | 50.7 | 47.1 | 41.5 | 36.7 |
| | CaseLoaded | 54.2 | 50.4 | 44.9 | 38.8 |
| | HS Loaded | n/a | 38.0 | 39.7 | 32.0 |
| | | Ran Well | Ran Well | Ran Well | Ran Well |
| 850 Mhz, 1.8 Volts Core, 57 Watts | Case Idle | 57.2 | 51.5 | 45.6 | 38.5 |
| | CaseLoaded | Overheated | 56.0 | 47.6 | 41.2 |
| | HS Loaded | — | 43.5 | 42.8 | 34.5 |
| | | System Failure | Unstable | Ran Well | Ran Well |
| 880 Mhz, 1.8 Volts Core, 62 Watts | Case Idle | — | 54.8 | 47.9 | 40.1 |
| | CaseLoaded | — | Overheated | 49.6 | 41.1 |
| | HS Loaded | — | — | 38.7 | 33.5 |
| | | — | System Failure | Ran Well | Ran Well |
| 920 Mhz, 1.8 Volts Core | Case Idle | — | — | Ran Well | |
| | CaseLoaded | — | — | Memory | |
| | HS Loaded | — | — | Failure | |
| | | — | — | | |
| 990 Mhz, 1.8 Volts Core | Case Idle | — | — | | |
| | CaseLoaded | — | — | | |
| | HS Loaded | — | — | | |
| | | — | — | | |

NOTES:
(1) Design as in FIG. 8
(2) Design as in FIG. 9
(3) Design as in FIG. 10

TABLE 2

Thermal Test Results using AMD Athlon 700 MHz Processor with Heatsink Systems of Example 2.

| Microprocess or Operating Conditions: Frequency, Core Voltage, Power Dissipated | Measurement Condition | Standard AMD Air-Cooled Heatsink, (See Note 4) Operating Temperature (° C.) and Comments | Diamond Heatsink System 3, (See Note 5) Temperature (° C.) and Comments |
|---|---|---|---|
| 700 Mhz, 1.6 Volts Core, 34 Watts | Case Idle | 46.8 | 30.1 |
| | Case Loaded | 48.5 | 31.9 |
| | HS Loaded | n/a | — |
| | | Ran Well | Ran Well |
| 800 Mhz, 1.7 Volts Core, 48 Watts | Case Idle | 50.7 | 32.8 |
| | Case Loaded | 54.2 | 37 |
| | HS Loaded | n/a | n/a |
| | | Ran Well | Ran Well |
| 850 Mhz, 1.8 Volts Core, 57 Watts | Case Idle | 57.2 | 38.1 |
| | Case Loaded | Overheated | 41.1 |
| | HS Loaded | — | — |
| | | System Failure | Ran Well |
| 880 Mhz, 1.8 Volts Core | Case Idle | — | — |
| | Case Loaded | — | — |
| | HS Loaded | — | — |
| | | — | — |
| 920 Mhz, Volts Core | Case Idle | — | — |
| | Case Loaded | — | — |
| | HS Loaded | — | — |
| | | — | — |

NOTES:
(4) Design as in FIG. 8
(5) Design as in FIG. 11

TABLE 3

Thermal Test Results using AMD Athlon 700 MHz Processor with Heatsink Systems of Example 3.

| Microprocess or Operating Conditions: Frequency, Core Voltage, Power Dissipated | Measurement Condition | Diamond Heatsink System 3, (See Note 6) Temperatures (° C.) and Comments |
|---|---|---|
| 800 Mhz, 1.6 Volts Core, 43 Watts | Case Idle Case Loaded HS Loaded | 42.9 46.8 39.6 Ran Well |
| 850 Mhz, Volts Core, | Case Idle Case Loaded HS Loaded | — — — |
| 900 Mhz, 1.8 Volts Core, 67 Watts | Case Idle Case Loaded HS Loaded | 49.0 53.1 42.6 Ran Well |
| 950 Mhz, 1.8 Volts Core 77 Watts | Case Idle Case Loaded HS Loaded | 49.1 53.9 43.3 Ran Well |
| 1000 Mhz, 1.9 Volts Core, 97 Watts | Case Idle Case Loaded HS Loaded | 56.8 58.1 46.3 Ran Well-Cache Off |

NOTES:
(6) Design as in FIG. 11

Thick Film Process for Metallization of Diamond Insert

Another aspect of the present invention is the metallization of the diamond heatspreader insert before placing the insert within the metal heatsink for the purpose of joining the two items. The thermal resistance at the interface should be kept to a minimum for efficient heat transfer. Also, a reliable and robust bond is needed to join the diamond to the metal heatsink material, e.g. copper. Polymers are not optimum interface materials for joining because of their low thermal conductivity.

A metal alloy with a relatively high thermal conductivity, such as eutectic solder, is the preferred method of joining the copper heatsink and the diamond heatspreader insert. It is possible to make a solder junction by a number of methods, but it is also important that the fabrication method is, (1) relatively inexpensive and (2) that the joining take place at relatively low temperatures. The second point is important because of the difference in the coefficient of thermal expansion (CTE) between the diamond and the copper material. Stresses accumulated in the diamond from the CTE difference after cooling from the solder melting temperature may cause the diamond to crack depending on the melting temperature of the solder and the thickness of the diamond.

It is preferred that a primary layer of metal is bonded onto the diamond heatspreader insert for the purpose of solder wetting and adhesion. Although a number of thin film structures exist that can serve as a primary layer, the deposition methods require vacuum processing, which is relatively expensive. The methods of thick film technology provide the preferred method of inexpensively fabricating a metal layer onto the surface on the diamond insert. This metal layer must have sufficiently robust adhesion with the diamond such that it can withstand soldering at temperatures using conventional eutectic solders. This approach, however, does not preclude the possibility of applying a low temperature metal-based paste that exhibits good adhesion to both diamond insert and copper without the requirement for a primary metal layer.

A thick film paste exhibiting the required properties preferably contains the components of an "active brazing alloy" specific to diamond. More specifically, an alloy commonly known as "Ticusil" has been proven to have good adhesion to diamond. This alloy contains, by weight, approximately 68.8% Ag, 26.7% Cu, and 4.5% Ti. Modified versions work as well, leading to a variety of alloys that may be used in this application. Through methods consistent with thick film technology, a suitable thick film metal-based paste is deposited onto the diamond and fired at relatively high temperatures, i.e., about 750° to about 900° C. This alloy can be fired in an inert ambient, such as argon, which does not result in deterioration of the diamond at high temperatures. After firing, the resulting metal layer has extremely good adhesion and can be conditioned, if necessary, to permit solder wetting for the joining to the metal, e.g. copper. The metal layer can be abrasively polished to make the surface wettable for soldering, or electroplating prior to soldering if necessary.

Another material that may be compatible with this application and substituted for Ticusil is called Superbraze™ 250, based on Ag, Sn, and Ti and has a melting point at 250-280° C. Because this alloy can be fired a much lower temperatures than Ticusil, air may be used as the ambient. It is preferred that an inert ambient such as argon is used.

Application of the primary metal layer to both sides of the diamond may aid in minimizing the curvature in the diamond heatspreader insert Such a curvature can be caused from the mismatch of the coefficient of thermal expansion (CTE) between the metal layer and the diamond. For a bilayer structure, comprised of the diamond insert coated with the metal on one side only, a curvature could result provided that the metal layer is sufficiently thick. The minimum metal layer thickness is typically about 7 to 10 microns using standard screen printing techniques. Such curvature would make intimate contact between the diamond and the metal heatsink more difficult to achieve. If a trilayer structure is made, comprised of the diamond insert that has the primary metal layer fired on both sides, preferably simultaneously, then CTE-induced stress will balance such that no curvature will be present in the structure. In a structure with very little curvature, only a minimal amount of solder is required to establish intimate contact between the diamond insert and the copper, resulting in greater heat transfer efficiency.

Additionally, if there is initial curvature in the diamond resulting from the growth conditions of the diamond fabrication (growth-induced curvature), then it may be sufficient to apply the metal layer only on one side. Because of CTE considerations, it is necessary to apply the metal paste to the concave side of the diamond insert. Under certain diamond growth conditions, for example, the surface of concave curvature also possesses a high degree-of surface roughness, as it is composed of highly faceted polycrystalline diamond. As such, this surface needs to be planarized prior to bonding to the metal heatsink to achieve good thermal contact. A sufficient thickness of the metal paste may then be applied such that the faceted surface becomes planarized after firing and polishing. In addition, when the metal primary layer is applied only to the side of the diamond insert with concave curvature, then the CTE-induced stress after firing the primary metal layer will counteract the growth-induced curvature, malting it less concave.

Thus, the thick paste can be used to simultaneously provide (1) a metallized surface, (2) a planarized surface, (3) and a reduction of the growth-induced surface curvature. The resultant diamond heatspreader insert will then have less curvature then the as-grown diamond material, making it easier to establish intimate contact to the metal heatsink. It is anticipated that many variations of the diamond and primary metal layer(s) thickness(es) are possible. These variations are dependent on the fabrication method of the diamond insert, its surface roughness, and its thickness.

The following summarizes options based on thick-film pastes, within a generally preferred framework of process steps, that can be used to accomplish the primary metallization step and solder joining in the method of making the cooling system of the present invention:

1. Apply a thick film active brazing alloy paste, as noted above, to either one or two sides of the side of the CVD diamond piece, depending on the initial curvature of the diamond insert. This may be accomplished by:
   a. spraying (air-brush)
   b. using a spin-on process (as in wafer coating technology)
   c. screen printing (preferably on relatively flat diamond)
   d. painting (brush)
2. Dry paste at 150° C. for approximately 10 minutes.
3. Fire in an argon (preferred) ambient at 200-1000° C. depending on the constituents of the paste.
4. Preferably condition the metallized surface by polishing the excess metal until the surface is relatively planarized and lustrous.
5. If necessary, electroplate the metallized portion of diamond (or electroless plate) with Ni/Au or Cu and the like. The necessity of this step depends on whether the solder used for joining is compatible with the primary metal alloy on the diamond and the copper heatsink. It is assumed that a compatible metal joining scheme is used, of which there are many varieties.
6. Apply a compatible, low melting temperature solder, e.g., Bi—Sn, Pb—Sn eutectics, preferably by screen printing.
7. Reflow (melt) solder at atmosphere, preferably in an inert or reducing atmosphere to minimize oxidation; cool to room temperature; remove flux with solvents. This eliminates the organic constituents in the flux. As a refinement to this step, the solder is preferably reflowed at the center of the diamond insert, such that the thickest portion of the wetted solder remains at the center.
8. Place diamond insert with the solder in contact with copper heatsink for bonding, preferably such that the diamond is on top of the assembly. Place a suitable weight on the diamond to ensure good contact between the diamond and the copper. Place the assembly at room temperature in vacuum oven. Under moderate vacuum, slowly heat the assembly to slightly above the solder reflow temperature and allow solder wetting to take place between the diamond and copper heatsink until intimate contact is achieved at the interface, then allow cooling to room temperature. If most of the solder was initially confined to the center of the insert, as suggested in step 7, then upon melting the second time, the solder will flow to fill in the gaps between the diamond insert and the copper as the wetting progresses in the vacuum. This refinement reduces the formation of voids between the diamond insert and the copper heatsink to allow efficient heat transfer. A background ambient of 4% hydrogen in argon at the reduced pressure may be used to avoid oxidation of the solder.

Alternatively, a direct-bond process can be used to form the primary metallization on the diamond heatspreader insert in the method of making the cooling system of the present invention: This process relates to brazeable diamond products and methods for making them wherein the layer of the primary metal (i.e. copper, silver, or gold) is much thicker than previously thought possible. This layer is typically thicker than about 5 microns, and more particularly, may be thicker than about 10 microns, even more particularly greater than about 50 microns. It is possible to obtain layers of at least 75 microns, 100 microns, 150 microns, or 200 microns, or thicker. For this process, a three-layer vacuum-deposited coating is first applied the diamond heatspreader insert (the three layers provide adhesion to the diamond, a diffusion barrier during further processing and an oxidation barrier for further processing, refer to co-pending U.S. patent application Ser. No. 09/965,478), and contacting the outer layer of this coating with the primary metal in sufficient amount and at a temperature at or above the melting point of the primary metal, to deposit the desired thickness of metal onto the coated diamond insert. Desirably, this contact with the primary metal is accomplished by preparing a film, foil, or shim of the metal of the desired size and thickness, and disposing it adjacent to the outer coating layer of the diamond insert. The material is then heated to a temperature at or above the melting point of the metal shim, and maintained at this temperature for a time sufficient for the metal film, foil, or shim to at least partially melt, and bond to the third layer of the vacuum-deposited coating.

Desirably, the primary metal is the same metal as is used in the third coating layer. Copper has been found to be a particularly suitable metal in this regard, and is used in the example below; it will be recognized that silver or gold could also be used. When applied as a film, foil, or shim, a thickness between about 10 and about 200 microns is used, but may range between about 20 and about 200 microns, between about 50 and about 200 microns, between about 75 and about 200 microns, between about 100 and about 200 microns, or between about 150 and about 200 microns depending on the thickness and area of the diamond insert.

When a copper shim is used, the combination of coated diamond insert and copper shim is heated in a furnace in an inert or reducing atmosphere to a temperature at or above the melting point of the copper, i.e., at or above about 1100° C., for a time sufficient to melt some or all of the copper shim. Without wishing to be bound by any theory, it is believed that contact of the coated substrate with molten metal from the shim or from the third layer (which can also become molten at the temperature at or above the melting point of the second metal) is significant in achieving a thick metallization without significant risk of delamination. This may occur because the molten metal in the shim or the outer layer of coating helps to "wet" the barrier refractory metal layer. It will be understood that the complete melting of the copper shim may result in some flow of copper across the surface of the coated diamond substrate, so that the thickness of copper may not be completely uniform. However, the addition of the thick metallization layer planarizes the coated surface, adds mechanical stability, allows attachment of materials with high coefficients of thermal expansion to the coated substrate, and provides for more efficient heat transfer from the diamond heatspreader insert to the metal heat sink.

The following summarizes one option based on direct bond copper, within a generally preferred framework of process steps, that can be used to accomplish the primary metallization step and solder joining in the method of making the cooling system of the present invention:

1. Laser cut the diamond insert to the required size.
2. This process can be used on either side of the diamond insert (i.e. substrate side or growth side (with crystals)).
3. Deposition of a first layer of magnetron-sputtered Chromium (2000 angstroms) onto the diamond insert
4. Deposition of a second layer of magnetron-sputtered Tungsten (3000 angstroms) onto the diamond insert
5. Deposition of a third layer of magnetron-sputtered Copper (10,000 angstroms) onto the diamond insert.
6. Prepare a copper shim with 500,000 A (50 microns) thickness and dimensions that are slightly smaller than the diamond insert.
7. Place the copper shim onto the diamond insert adjacent to previously deposited metallization layers.
8. Heat in a furnace in an atmosphere of flowing 4-5% hydrogen in argon to 1100° C. long enough for copper to melt (1 minute).
9. Allow to cool in flowing 4-5% hydrogen in argon gas mixture back to room temperature, nominally 45 minutes.
10. The result would be a diamond insert with a totally adherent, lustrous layer of copper metallization that varied in thickness up to approximately 110 microns.
11. Polishing may be required in order to planarize the primary metal layer before further processing.
12. Apply a compatible, low melting temperature solder, e.g., Bi—Sn, Pb—Sn eutectics, to the primary metalized diamond insert, preferably by screen printing.
13. Reflow (melt) solder at atmosphere, preferably in an inert or reducing atmosphere to minimize oxidation; cool to room temperature; remove flux with solvents. This eliminates the organic constituents in the flux. As a refinement to this step, the solder is preferably reflowed at the center of the diamond insert, such that the thickest portion of the wetted solder remains at the center.
14. Place diamond insert with the solder in contact with copper heatsink for bonding, preferably such that the diamond is on top of the assembly. Place a suitable weight on the diamond to ensure good contact between the diamond and the copper. Place the assembly at room temperature in vacuum oven. Under moderate vacuum, slowly heat the assembly to slightly above the solder reflow temperature and allow solder wetting to take place between the diamond heatspreader insert and copper heatsink until intimate contact is achieved at the interface, then allow cooling to room temperature. If most of the solder was initially confined to the center of the insert, as suggested in step 13, then upon melting the second time, the solder will flow to fill in the gaps between the diamond insert and the copper as the wetting progresses in the vacuum. This refinement reduces the formation of voids between the diamond insert and the copper heatsink to allow efficient heat transfer. A background ambient of 4% hydrogen in argon at the reduced pressure may be used to avoid oxidation of the solder.

Without departing from the spirit and scope of this invention, one of skill in the art can make various changes and modifications to the invention to adapt it to various usages and conditions. As such, these changes and modifications are properly, equitably, and intended to be, within the full range of equivalents of the following claims.

What is claimed is:

1. A microprocessor cooling system, which comprises:
   a. a heat sink body for mounting to a microprocessor circuit board, the heat sink body including a plurality of cooling fins and a base having an outer surface;
   b. at least one cooling fan mounted on the cooling fins for directing a cooling gas through the fins; and
   c. a chemical vapor deposited diamond heatspreader having a first and a second surface, wherein the first surface is adapted to be mounted to the heat sink base and the second surface is adapted to be mounted directly onto a main microprocessor chip of a microprocessor circuit board, and having at least one chemically or mechanically planarized surface.

2. The cooling system of claim 1 wherein the base is joinable to said diamond heatspreader by a copper shim.

3. The cooling system of claim 1 wherein said chemical vapor deposited diamond heatspreader further comprises a metallization film obtained by metallizing one or more surfaces of the heatspreader prior to being mounted onto said heat sink body.

4. The cooling system of claim 3 wherein said metallization film comprises a layer resulting from applying a thick film active brazing alloy paste to at least a portion of it, drying the paste and firing the film covered diamond at temperatures in the range of about 200° to about 1000° C.

5. The cooling system of claim 4 wherein said alloy paste is Ticusil.

6. The cooling system of claim 4 wherein said metallization film covered diamond heatspreader has been planarized after firing.

7. The cooling system of claim 6 wherein a low melting temperature solder is applied to said polished diamond heatspreader prior to being mounted to the base of the heatsink.

8. The cooling system of claim 1, wherein the at least one chemically or mechanically planarized surface comprises the second surface.

9. The cooling system of claim 1, wherein the at least one chemically or mechanically planarized surface comprises the first surface.

10. The cooling system of claim 1, wherein the at least one chemically or mechanically planarized surface has a surface roughness between 0.1 micron and 0.03 micron.

11. A microprocessor cooling system, which comprises:
    a. a heat sink body for mounting to a microprocessor circuit board including a plurality of cooling fins having out ends and inner ends, a heat sink base having two ends, an inner surface attached to said inner ends and an outer surface having a depression equidistant from each of the ends;
    b. at least one cooling fan mounted on said outer ends of said cooling fins for directing a cooling gas through the fins; and
    c. a copper insert having an indent equidistant from each of the ends of said heat sink body and mounted within said depression and a chemical vapor deposited diamond heatspreader insert having an inner surface mounted within said indent and an outer surface positioned for mounting directly onto a main microprocessor chip of said microprocessor circuit board.

12. The cooling system of claim 11, wherein the base has two ends and the lower surface adjacent each of the ends of said base is joinable to said microprocessor circuit board by means of a copper shim.

13. The cooling system of claim 12, wherein the diamond heatspreader is metallized and planarized prior to being mounted within said indent of said copper insert.

14. A microprocessor cooling system, which comprises:
    a. a heat sink body for mounting to a microprocessor circuit board, the heat sink body including a plurality of cooling fins and a base having an outer surface;

b. at least one cooling fan mounted on the cooling fins for directing a cooling gas through the fins; and c. a chemical vapor deposited diamond heatspreader having a first and a second surface, wherein the first surface is adapted to be mounted to the heat sink base and the second surface is adapted to be mounted directly onto a main microprocessor chip of a microprocessor circuit board, wherein at least one of the first and second surfaces is coated with a metal film.

15. The cooling system of claim 14, wherein the metal film has been planarized.

16. The cooling system of claim 14, wherein the metal film comprises an active brazing alloy.

17. The cooling system of claim 16, wherein the active brazing alloy comprises a TiCuSil alloy or a Ti/Sn/Ag alloy.

18. The cooling system of claim 16, wherein the metal film further comprises Ni/Au or Cu.

19. The cooling system of claim 14, wherein the metal film comprises Cr, W, and Cu.

* * * * *